United States Patent
Cruse et al.

(10) Patent No.: US 8,707,754 B2
(45) Date of Patent: *Apr. 29, 2014

(54) METHODS AND APPARATUS FOR CALIBRATING FLOW CONTROLLERS IN SUBSTRATE PROCESSING SYSTEMS

(75) Inventors: James P. Cruse, Santa Cruz, CA (US); John W. Lane, San Jose, CA (US); Mariusch Gregor, San Jose, CA (US); Duc Buckius, San Jose, CA (US); Berrin Daran, Bruddock, CT (US); Corie Lynn Cobb, Mountain View, CA (US); Ming Xu, San Jose, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 610 days.

This patent is subject to a terminal disclaimer.

(21) Appl. No.: 12/915,345

(22) Filed: Oct. 29, 2010

(65) Prior Publication Data

US 2011/0265549 A1 Nov. 3, 2011

Related U.S. Application Data

(60) Provisional application No. 61/330,056, filed on Apr. 30, 2010.

(51) Int. Cl.
*G01F 25/00* (2006.01)
*H01L 21/66* (2006.01)
*F16K 37/00* (2006.01)
*H01L 21/67* (2006.01)
*H01L 21/306* (2006.01)
*H01L 21/36* (2006.01)

(52) U.S. Cl.
CPC .......... *H01L 21/67253* (2013.01); *G01F 25/00* (2013.01); *F16K 37/0091* (2013.01); *F16K 37/00* (2013.01)
USPC ................ 73/1.35; 29/705; 73/1.26; 73/1.34; 137/551; 137/594; 137/606; 137/861; 156/345.26

(58) Field of Classification Search
CPC ..... F16K 37/00; F16K 37/0091; G01F 25/00; G01F 25/0007; G01F 25/0053; H01L 21/67253
USPC .................. 29/25.01, 705, DIG. 16; 73/1.26, 73/1.34–1.36; 118/712, 719, 900, 715; 137/551, 594, 606, 861; 156/345.26, 156/345.32
See application file for complete search history.

(56) References Cited

U.S. PATENT DOCUMENTS 5,304,398 A * 4/1994 Krusell et al. .......... C23C 16/00
(Continued)

FOREIGN PATENT DOCUMENTS

EP            666340 A1 *  8/1995  .............. C23C 16/44
WO  WO 2005006390 A2 *  1/2005  .............. G01F 25/00

OTHER PUBLICATIONS

Product Data Sheet "GBROR® Gas Box Rate-of-Rise In Situ Flow Verifier". Downloaded from web site http://www.mksinst.com/product/Product.aspx?ProductID=79 on Jun. 21, 2011, 2 pages.

(Continued)

*Primary Examiner* — Thomas P Noland
(74) *Attorney, Agent, or Firm* — Moser Taboada; Alan Taboada

(57) ABSTRACT

Methods and apparatus for calibrating a plurality of gas flows in a substrate processing system are provided herein. In some embodiments, a substrate processing system may include a cluster tool comprising a first process chamber and a second process chamber coupled to a central vacuum transfer chamber; a first flow controller to provide a process gas to the first process chamber; a second flow controller to provide the process gas to the second process chamber; a mass flow verifier to verify a flow rate from each of the first and second flow controllers; a first conduit to selectively couple the first flow controller to the mass flow verifier; and a second conduit to selectively couple the second flow controller to the mass flow verifier.

20 Claims, 4 Drawing Sheets

(56) References Cited

U.S. PATENT DOCUMENTS

| | | | |
|---|---|---|---|
| 5,684,246 A * | 11/1997 | Korpi | 73/1.36 |
| 6,596,091 B1 * | 7/2003 | Grosenbacher | 134/21 |
| 6,913,652 B2 | 7/2005 | Shan | |
| 7,174,263 B2 * | 2/2007 | Shajii et al. | G01F 25/0053 |
| 7,461,549 B1 * | 12/2008 | Ding et al. | G01F 25/0053 |
| 2002/0046612 A1 * | 4/2002 | Mudd | 73/861.52 |
| 2003/0003696 A1 | 1/2003 | Gelatos et al. | |
| 2004/0250600 A1 * | 12/2004 | Bevers et al. | 73/1.16 |
| 2005/0186339 A1 | 8/2005 | Rajagopalan et al. | |
| 2005/0241763 A1 | 11/2005 | Huang et al. | |
| 2006/0090702 A1 | 5/2006 | Koo et al. | |
| 2006/0278276 A1 * | 12/2006 | Tanaka et al. | 137/487.5 |
| 2007/0240769 A1 * | 10/2007 | Suzuki et al. | 137/487.5 |
| 2008/0299326 A1 * | 12/2008 | Fukazawa et al. | 427/569 |
| 2008/0302426 A1 * | 12/2008 | Mulligan et al. | 137/271 |
| 2009/0019943 A1 * | 1/2009 | Ozawa et al. | G01F 25/0007 |
| 2009/0064756 A1 * | 3/2009 | Hong et al. | 73/1.58 |
| 2009/0112491 A1 * | 4/2009 | Nakada et al. | G01F 25/0053 |
| 2009/0266139 A1 * | 10/2009 | Gregor et al. | G01F 25/00 |
| 2010/0229967 A1 * | 9/2010 | Yasuda et al. | G01F 25/0053 |
| 2011/0265951 A1 * | 11/2011 | Xu et al. | 156/345.26 |
| 2013/0081702 A1 * | 4/2013 | Mohammed et al. | 137/2 |
| 2013/0092243 A1 * | 4/2013 | Mohammed et al. | 137/2 |

OTHER PUBLICATIONS

Product Data Sheet "GBR3B Tru-Flo Mass Flow Verifier". Downloaded from web site http://www.mksinst.com/product/Product.aspx?ProductID=80 on Jun. 21, 2011, 2 pages.

International Search Report and Written Opinion mailed Jan. 4, 2012 for PCT Application No. PCT/US2011/033780.

* cited by examiner

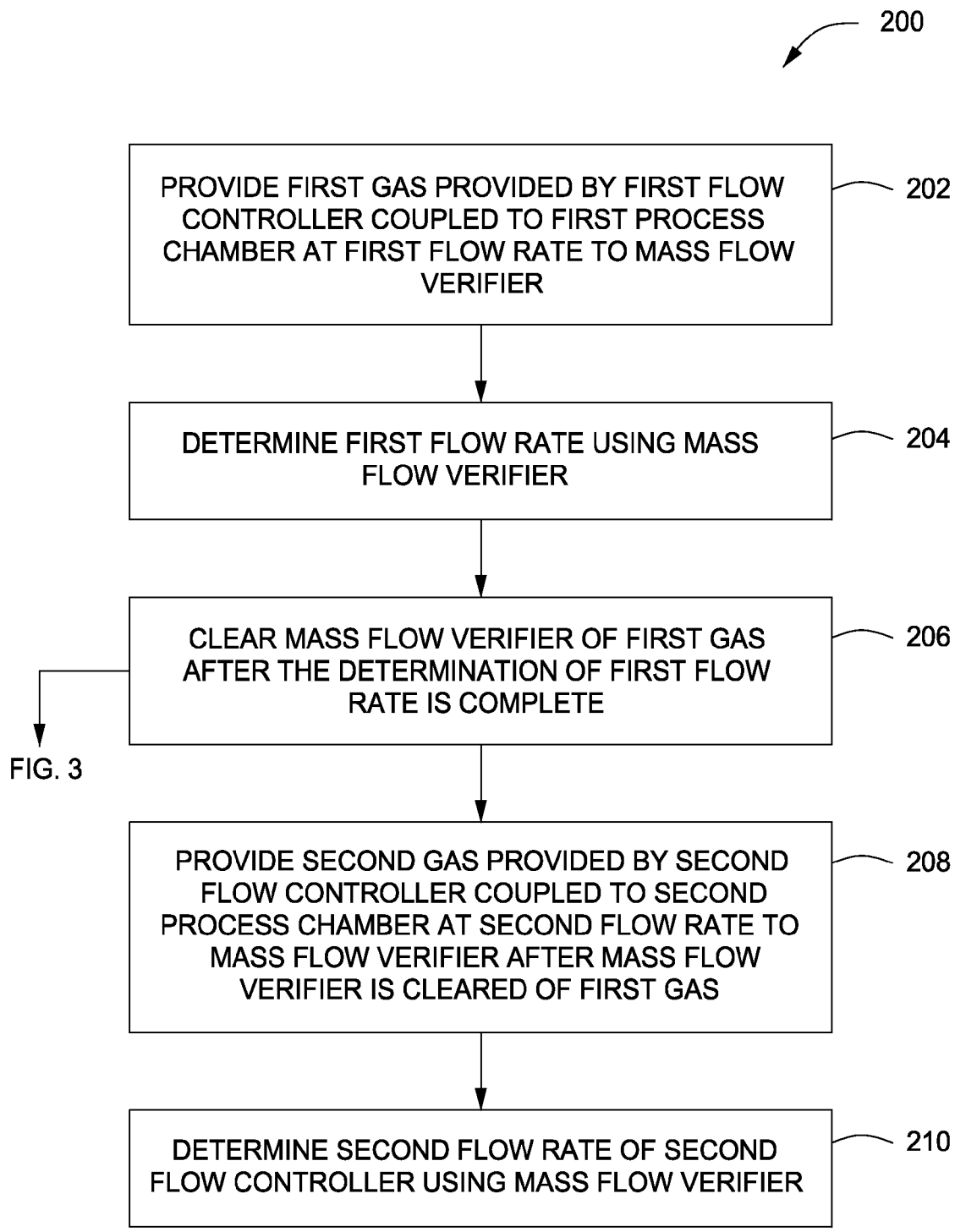

METHODS AND APPARATUS FOR CALIBRATING FLOW CONTROLLERS IN SUBSTRATE PROCESSING SYSTEMS

CROSS-REFERENCE TO RELATED APPLICATIONS

This application claims benefit of U.S. provisional patent application Ser. No. 61/330,056, filed Apr. 30, 2010, which is herein incorporated by reference.

FIELD

Embodiments of the present invention generally relate to substrate processing equipment.

BACKGROUND

During substrate processing, such as etching process, an inner volume of a process chamber may be exposed to one or more process gases. Often, such process gases are provided at desired flow rates controlled by one or more flow controllers that provide the process gases to the inner volume. In some process chamber configurations, for example where shared gas panels supply the process gases to multiple process chambers, the inventors have discovered that no methods exist for confirming that the process gases from the shared gas panel are being split correctly to each chamber by the flow controllers. In addition, the inventors have observed that there typically are not any on-tool apparatus available on a multi-chamber substrate processing system, such as a cluster tool, for monitoring the flow controllers of each chamber, for example, to detect drift or to compare drift between flow controllers on different chambers of the system.

Accordingly, the inventors have provided methods and apparatus for calibrating a plurality of flow controllers in substrate processing systems.

SUMMARY

Methods and apparatus for calibrating a plurality of gas flows in a substrate processing system are provided herein. In some embodiments, a substrate processing system may include a cluster tool comprising a first process chamber and a second process chamber coupled to a central vacuum transfer chamber; a first flow controller to provide a process gas to the first process chamber; a second flow controller to provide the process gas to the second process chamber; a mass flow verifier to verify a flow rate from each of the first and second flow controllers; a first conduit to selectively couple the first flow controller to the mass flow verifier; and a second conduit to selectively couple the second flow controller to the mass flow verifier.

In some embodiments, a substrate processing system may include a first flow controller to provide a process gas to a first zone of a first process chamber; a second flow controller to provide the process gas to a second zone of the second process chamber; a mass flow verifier to verify a flow rate from each of the first and second flow controllers; a first conduit to selectively couple the first flow controller to the mass flow verifier; and a second conduit to selectively couple the second flow controller to the mass flow verifier.

In some embodiments, a method for calibrating a plurality of flow controllers in a substrate processing system comprising a first process chamber and a second process chamber coupled to a central vacuum transfer chamber is provided, In some embodiments, the method may include providing a first gas at a first flow rate from a first flow controller coupled to a first process chamber; diverting the first gas to a mass flow verifier via a first conduit; determining the first flow rate using the mass flow verifier; providing a second gas at a second flow rate from a second flow controller coupled to a second process chamber; diverting the second gas to the mass flow verifier via a second conduit; and determining the second flow rate using the mass flow verifier.

In some embodiments, a method for calibrating a plurality of flow controllers in a substrate processing system is provided. In some embodiments, the method may include providing a first gas to a mass flow verifier by a first flow controller coupled to a first zone of a first process chamber; determining a first flow rate of the first gas using the mass flow verifier; providing a second gas to the mass flow verifier by a second flow controller coupled to a second zone of the first process chamber; and determining a second flow rate of the second gas using the mass flow verifier, wherein the first flow controller is capable of providing the first gas to the first zone while the second flow controller is providing the second gas to the mass flow verifier.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIG. 2 depicts a flow chart of a method for calibrating a plurality of flow controllers in a substrate processing system in accordance with some embodiments of the present invention.

Figure 1:
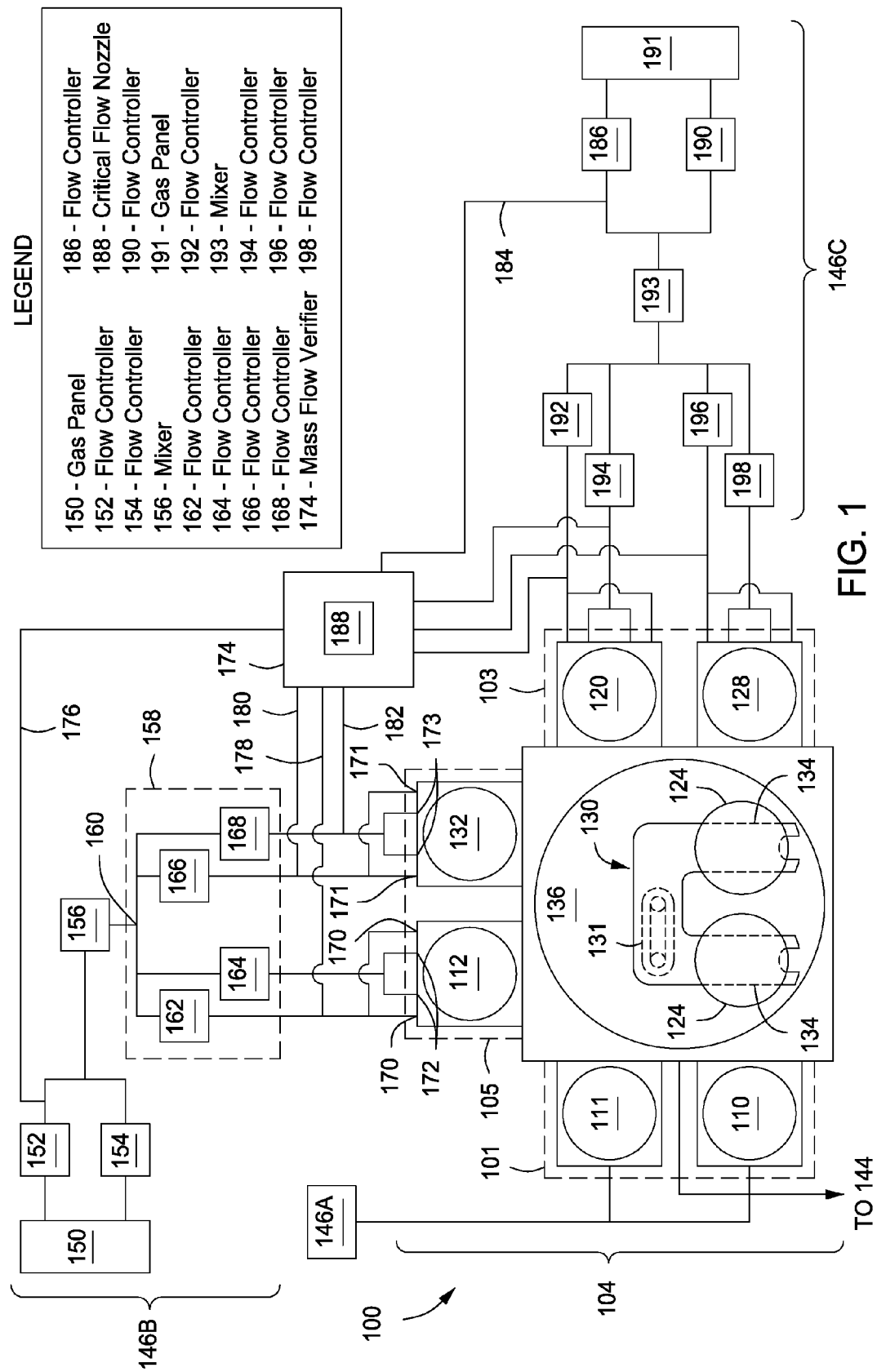
FIGS. 1-1A depict a schematic top view of a multi-chamber substrate processing system in accordance with some embodiments of the present invention.
Figure 1A:
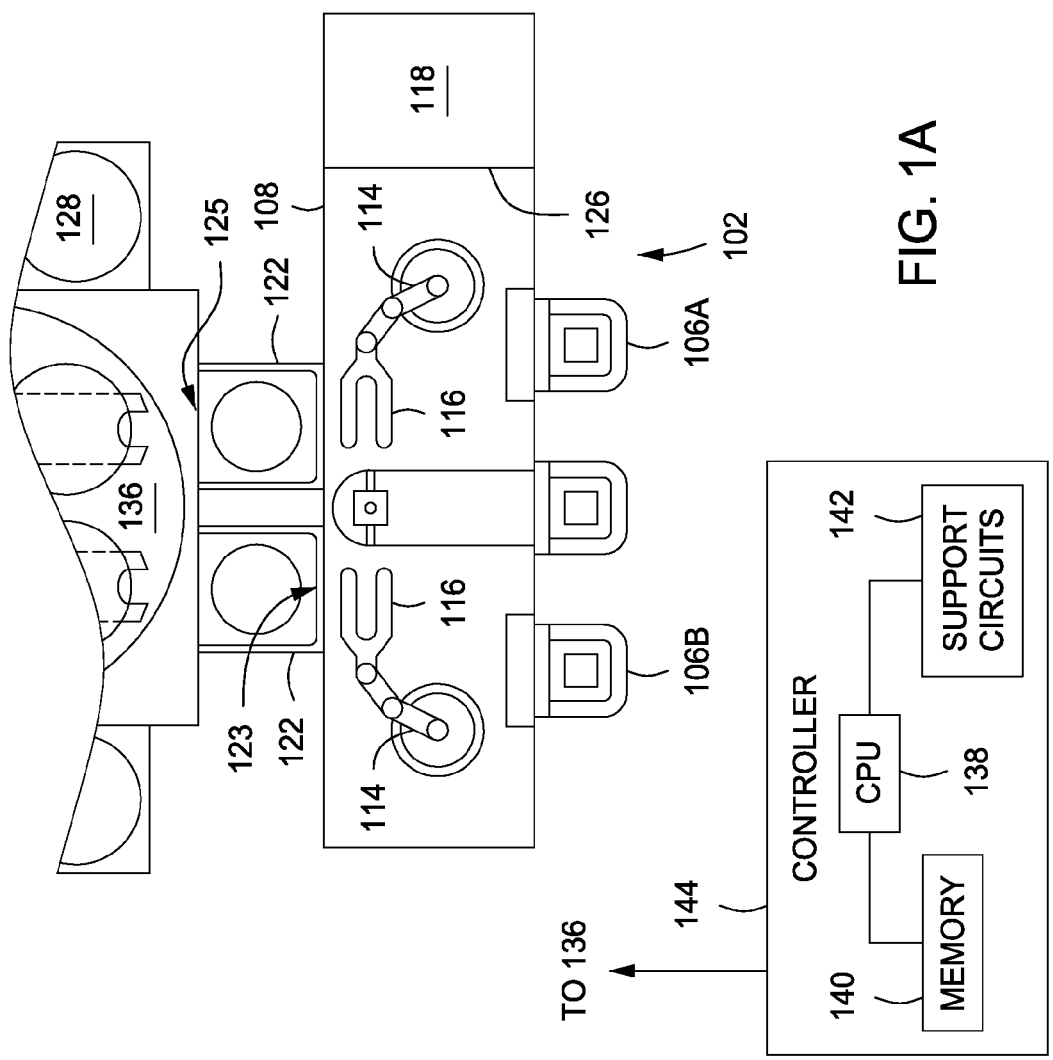

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for calibrating a plurality of flow controllers in a substrate processing system are disclosed herein. The inventive methods and apparatus advantageously facilitate measuring one or more flow rates provided by one or more flow controllers in direct comparison to both a reference standard (e.g., a mass flow verifier) and to other flow controllers coupled to one or more process chambers in various configurations. The inventive systems and methods thus may advantageously provide decreased time required to calibrate each of the flow controllers and improved uniformity between the flow controller measurements, thereby facilitating improved chamber matching (e.g., improved uniformity of process results between two different chambers operating under similar process conditions).

Referring to FIG. 1, in some embodiments, a cluster tool, or multi-chamber processing system 100 may generally comprise a factory interface 102, a vacuum-tight processing platform 104, and a system controller 144. Examples of a processing system that may be suitably modified in accordance with the teachings provided herein include the Centura® integrated processing system, one of the PRODUCER® line of processing systems (such as the PRODUCER® GT™), ADVANTEDGE™ processing systems, or other suitable processing systems commercially available from Applied Materials, Inc., located in Santa Clara, California. It is contemplated that other processing systems (including those from other manufacturers) may be adapted to benefit from the invention. One example of a twin chamber processing system that may be modified to incorporate the present invention in accordance with the teachings herein is described in United States Provisional Patent Application Ser. No. 61/330,156, filed Apr. 30, 2010, by Ming Xu, et al., and entitled, "Twin Chamber Processing System."

The platform 104 may include a plurality of processing chambers (six shown) 110, 111, 112, 132, 128, 120 and at least one load-lock chamber (two shown) 122 that are coupled to a transfer chamber 136. Each process chamber includes a slit valve or other selectively sealable opening to selectively fluidly couple the respective inner volumes of the process chambers to the inner volume of the transfer chamber 136. Similarly, each load lock chamber 122 includes a port 125 to selectively fluidly couple the respective inner volumes of the load lock chambers 122 to the inner volume of the transfer chamber 136. The factory interface 102 is coupled to the transfer chamber 136 via the load lock chambers 122.

In some embodiments, for example, as depicted in FIG. 1, the processing chambers 110, 111, 112, 132, 128, 120 may be grouped in pairs with each of the processing chambers 110 and 111, 112 and 132, and 128 and 120 in each pair positioned adjacent to one another. In some embodiments, each pair of process chambers may be part of a twin chamber processing system (101, 103, 105) where each respective pair of process chambers may be provided in a common housing with certain shared resources provided, as discussed herein. Each twin chamber processing system 101, 103, 105 may include a pair of independent processing volumes that may be isolated from each other. For example, each twin chamber processing system may include a first process chamber and a second process chamber, having respective first and second processing volumes. The first and second processing volumes may be isolated from each other to facilitate substantially independent processing of substrates in each respective process chamber. The isolated processing volumes of the process chambers within the twin chamber processing system advantageously reduces or eliminates processing problems that may arise due to multi-substrate processing systems where the processing volumes are fluidly coupled during processing.

In addition, the twin chamber processing system further advantageously utilizes shared resources that facilitate reduced system footprint, hardware expense, utilities usage and cost, maintenance, and the like, while at the same time promoting higher substrate throughput. For example, as shown in FIG. 1, the process chambers may be configured such that processing resources 146A, 146B, 146C (collectively 146) (i.e., process gas supply, power supply, vacuum pumping systems or the like) may be respectively shared between each of the processing chambers 110 and 111, 112 and 132, and 128 and 120, and/or within each pair of processing chamber in each twin processing system 101, 103, 105.

Other examples of shared hardware and/or resources may include one or more of a process foreline and roughing pump, AC distribution and DC power supplies, cooling water distribution, chillers, multi-channel thermo controllers, gas panels, controllers, and the like.

In some embodiments, the factory interface 102 includes at least one docking station 108 and at least one factory interface robot (two shown) 114 to facilitate transfer of substrates. The docking station 108 is configured to accept one or more (two shown) front opening unified pods (FOUPs) 106A-B. In some embodiments, the factory interface robot 114 generally comprises a blade 116 disposed on one end of the robot 114 configured to transfer the substrates from the factory interface 102 to the processing platform 104 for processing through the load lock chambers 122. Optionally, one or more metrology stations 118 may be connected to a terminal 126 of the factory interface 102 to facilitate measurement of the substrates from the FOUPs 106A-B.

In some embodiments, each of the load lock chambers 122 may include a first port 123 coupled to the factory interface 102 and a second port 125 coupled to the transfer chamber 136. The load lock chambers 122 may be coupled to a pressure control system which pumps down and vents the load lock chambers 122 to facilitate passing the substrates between the vacuum environment of the transfer chamber 136 and the substantially ambient (e.g., atmospheric) environment of the factory interface 102.

In some embodiments, the transfer chamber 136 has a vacuum robot 130 disposed therein. The vacuum robot 130 generally comprises one or more transfer blades (two shown) 134 coupled to a movable arm 131. In some embodiments, for example where the processing chambers 110, 111, 112, 132, 128, 120 are arranged in groups of two, as depicted FIG. 1, the vacuum robot 130 may have two parallel transfer blades 134 configured such that the vacuum robot 130 may simultaneously transfer two substrates 124, 126 from the load lock chambers 122 to each pair of processing chambers (e.g., 110 and 111, 112 and 132, and 120 and 128).

The processing chambers 110, 111, 112, 132, 120, 128 may be any type of process chamber utilized in substrate processing. However, to utilize the shared resources, each pair of processing chambers is the same type of chamber, such as an etch chamber, a deposition chamber, or the like. Non-limiting examples of suitable etch chambers that may be modified in accordance with the teachings provided herein include any of the Decoupled Plasma Source (DPS) line of chambers, a HART™, E-MAX®, or ENABLER® etch chamber available from Applied Materials, Inc., of Santa Clara, Calif. Other etch chambers, including those from other manufacturers, may be utilized.

Each pair of process chambers 110 and 111, 112 and 132, and 120 and 128 may have shared resources 146A, 146B, or 146C. For example, in some embodiments, the shared resources may include a shared gas panel (for example, as illustrated in FIG. 1 for shared resources 146B, 146C) for providing a process gas as discussed below. Further, the shared resources may include a shared vacuum pump for pumping down each process chamber in combination with an adjacent chamber or individually. Alternatively or in combination with the shared vacuum pump, each process chamber may include an individual vacuum pump (not shown) for pumping down an inner volume of each process chamber.

In some embodiments, the shared resources include a shared gas panel between process chambers. For example, the shared resource 146B includes a shared gas panel 150 that is shared between the process chamber 112 and the process chamber 132 as illustrated in FIG. 1. The shared gas panel 150 may, for example, include a plurality of process gas sources that are coupled to the process chambers 112, 132 via a plurality of flow controllers and associated apparatus. As used herein, the term flow controllers refers to any apparatus for controlling the rate of flow of a gas or gases flowing through the flow controller, such as mass flow controllers, flow ratio control devices, flow control orifices, or the like. For example, each gas source of the shared gas panel 150 may be coupled to a mass flow controller that meters the gas from the gas source at a desired flow rate. For example, a first process gas from a first process gas source (not shown) of the gas panel 150 may be metered through a flow controller 152 and a second process gas from a second gas source (not shown) of the shared gas panel 150 may be metered through a flow controller 154. The first and second process gases may exit the flow controllers 152, 154 and enter a mixer 156 which may be coupled to respective outlets of each flow controller 152, 154. The first and second process gases may be mixed, or homogenized, in the mixer 156 in a ratio relative to the respective amounts of each process gas metered out by the flow controllers 152, 154.

From an outlet of the mixer 156, the mixed first and second process gases may be distributed to the process chambers 112, 132 via a multi-channel flow ratio controller or another similar apparatus that can control the gas respectively provided to each process chamber, and, optionally, to two or more zones within a given process chamber. For example, a multi-channel flow ratio controller 158 may include a shared inlet 160 for receiving the mixed first and second processes gases from the outlet of the mixer and may distribute the mixed first and second process gases to the process chambers 112, 132 via one or more flow controllers, such as mass flow controllers, flow ratio controllers, fixed orifices, or the like, or combinations thereof. In the embodiment depicted in FIG. 1, two pairs of flow controllers 162, 164, 166, 168, are shown with a first pair of flow controllers (e.g., 162, 164) coupled to the process chamber 112 and a second pair of flow controllers (e.g., 166, 168) coupled to the process chamber 132.

The multi-channel flow ratio controller 158, for example, may include one or more flow controllers each providing the mixed first and second process gas to each process chamber 112, 132 (two flow controllers coupled to each chamber depicted in FIG. 1). For example, the flow controllers 162, 164 provide the mixed first and second process gas to the process chamber 112 and the flow controllers 164, 166 provide the mixed first and second process gas to the process chamber 132. Each pair of flow controllers, for example flow controllers 162, 164, may provide the mixed first and second process gas to each process chamber, for example the process chamber 112, at different flow rates. For example, the flow controller 162 may provide the mixed first and second process gas through a first inlet 170 of the process chamber 112 at a different rate than provided by the flow controller 164 through a second inlet 172 of the process chamber 112. For example, the first and second inlets 170, 172 may be inner and outer zones of a showerhead (not shown), different zones of gas inlets, or the like.

The multi-chamber substrate processing system 100 further includes a mass flow verifier 174 to verify a flow rate from each of the flow controllers discussed above and further any flow controller in need of flow rate verification in the system 100. For example, such additional flow controllers may be part of the shared resource 146A or the shared resource 146C. The shared resources 146A and 146C may have a shared gas panel and flow controller configuration similar to that described above for shared resource 146B.

The mass flow verifier 174 may be any suitable apparatus for verifying the flow rate of a gas provided by a mass flow controller. Such mass flow verifiers may operate, for example, by monitoring the rate of rise of a pressure in a known volume over a period of time, or by some other suitable method for independently confirming the flow rate of any flow controller being monitored by the mass flow verifier 174. In some embodiments, the mass flow verifier 174 may be mounted on one of the twin chamber processing systems 101, 103, 105. In some embodiments, the mass flow verifier 174 may be mounted on the transfer chamber 136 of the multi-chamber processing system 100, or in some other suitable location for being coupled to each of the flow controllers coupled to each of the process chambers of the multi-chamber processing system 100.

The mass flow verifier 174 may be selectively coupled to each flow controller by individual conduits disposed below (e.g., downstream of) an outlet of the flow controller. By selectively coupling each flow controller to the mass flow verifier via individual conduits, rather than by a single conduit coming from a manifold where the process gases are mixed together, the inventive apparatus facilitates independent verification and/or calibration of each flow controller without impacting the ability of the other flow controllers from providing process gases while verifying or calibrating the flow from one of the flow controllers.

Each conduit may be respectively coupled to a given flow controller at a location downstream of the flow controller by a multi-way valve (not shown), or the like, that may selectively couple a respective flow controller to either the process chamber or the mass flow verifier 174. For example, when it is desired to verify a flow rate of a flow controller, a process gas that would normally flow from the outlet of a flow controller towards a process chamber may be diverted into the conduit by a multi-way valve to flow into the mass flow verifier 174. During the verification period, the flow controller being verified does not provide a process gas to a process chamber, but all other flow controllers of the system 100 may continue to provide a process gas to a process chamber, for example to process a substrate or the like. In some embodiments, flow may be bypassed around the mass flow verifier 174 so that the conduits can be quickly evacuated without having to flow through the mass flow verifier 174, thereby speeding up gas switchover purging between different gas flows being verified.

For example, several conduits are illustrated in FIG. 1 which couple respective flow controllers to the mass flow verifier 174. Some conduits are omitted for the purpose of clarity in FIG. 1. However, each flow controller of the process system 100 may have a conduit coupling the given flow controller to the mass flow verifier 174. For example, a conduit 176 couples the flow controller 152 to the mass flow verifier 174. A similar conduit (not shown) couples the flow controller 154 to the mass flow verifier 174. Similarly, conduits 178, 180 couple the mass flow verifier 174 to respective flow controllers 162, 166, which may provide similar (or the same) gas flows to corresponding regions or zones in adjacent process chamber 112, 132. Further, conduits may be coupled to multiple flow controllers which provide a process gas to the same chamber. For example, the conduit 180 couples the flow controller 166 to the mass flow verifier 174 and a conduit 182 couples the flow controller 168 to the mass flow verifier 174, where the flow controllers 166, 168 provide a process gas to the process chamber 132.

In some embodiments, all the conduits coupling the respective flow controllers of the system 100 to the mass flow verifier 174 may have substantially equivalent or about the same flow conductance. As used herein, substantially equivalent (or about the same) includes about +/−10 percent variation in conductance. Alternatively, and in some embodiments, the conduits coupling flow controllers providing process gases to corresponding regions in different process chambers (e.g., the first zone in each process chamber, the second zone in each process chamber, or the like) may have substantially similar or about the same flow conductance. For example, the conduits 178, 180 which couple flow controllers 162, 166 on adjacent process chambers 112, 132 may have substantially similar or about the same flow conductance such that a comparison of a flow rate of each flow controller 162, 166 may be made by the mass flow verifier 174. Similarly, the conduit 176 coupling the flow controller 152 to the mass flow verifier 174 and a conduit 184 coupling a flow controller 186 to the mass flow verifier may have substantially similar or about the same flow conductance. In the preceding example, the flow controller 186 is a flow controller that provides the same process gas to the twin chamber processing system 103 as the flow controller 152 provides to the twin chamber processing system 105.

Alternatively, or in combination with having all or pairs of conduits having substantially similar flow conductance, the mass flow verifier 174 may be configured for choked flow where, for example, a flow rate of a process gas entering the mass flow verifier 174 from a conduit is independent of the flow conductance in that conduit. For example, the mass flow verifier 174 may further comprise a critical flow nozzle 188 disposed at an inlet of the mass flow verifier 174 such that the process gas flows through the critical flow nozzle when entering the mass flow verifier 174. The critical flow nozzle 188 may be configured, for example based on inlet and outlet hole diameter, length, shape or the like, to normalize a flow rate of any gas which enters the critical flow nozzle 188 independent of the flow conductance in a conduit from which the gas originated. For example, the critical flow nozzle may provide a restriction such that a pressure drop across the critical flow nozzle is provided that at least halves the pressure (e.g., a first pressure immediately upstream of the critical flow nozzle is at least two times greater than a second pressure immediately downstream of the critical flow nozzle). Alternatively or in combination with having all or pairs of conduits having substantially similar flow conductance and/or the mass flow verifier 174 being configured for choked flow, in some embodiments, the downstream conductance may be minimized to provide lower baseline pressures which enable higher flow rates to be used.

The system controller 144 is coupled to the processing system 100 for controlling the processing system 100 or components thereof. For example, the system controller 144 may control the operation of the system 100 using a direct control of the process chambers 110, 111, 112, 132, 128, 120 of the system 100 or alternatively, by controlling the computers (or controllers) associated with the process chambers 110, 111, 112, 132, 128, 120 and the system 100. In operation, the system controller 144 enables data collection and feedback from the respective chambers and system controller 144 to optimize performance of the system 100.

The system controller 144 generally includes a central processing unit (CPU) 138, a memory 140, and support circuits 142. The CPU 138 may be one of any form of a general purpose computer processor that can be used in an industrial setting. The memory, or computer-readable medium, 140 is accessible by the CPU 138 and may be one or more of readily available memory such as random access memory (RAM), read only memory (ROM), floppy disk, hard disk, or any other form of digital storage, local or remote. The support circuits 142 are conventionally coupled to the CPU 138 and may comprise cache, clock circuits, input/output subsystems, power supplies, and the like. The inventive methods disclosed herein may generally be stored in the memory 140 (or in memory of a particular process chamber pair, as discussed below) as a software routine that, when executed by the CPU 138, causes the pair of process chambers to perform processes in accordance with the present invention.

FIG. 2 depicts a flow chart of a method 200 for calibrating a plurality of flow controllers in a substrate processing system in accordance with some embodiments of the present invention. The method 200 will be described below in accordance with the inventive apparatus described in FIG. 1.

At 202, a first gas may be provided by a first flow controller coupled to a first process chamber at a first flow rate to a mass flow verifier. For example, the first flow controller may be any flow controller of the system 100 as described above, however, the method 200 will be described below with respect to the flow controllers 162, 166, and 168 of the twin chamber process system 105. Accordingly, for the purposes of discussing the method 200, the first flow controller may be the flow controller 166 which may provide a first gas to the process chamber 132 under typical operating conditions; however, during flow verification the first gas is diverted as discussed above through the conduit 180 to the mass flow verifier 174. For example, during typical operating conditions, the flow controller 166 provides the first gas to the process chamber via a first inlet 171, where the first inlet 171 is substantially equivalent to the first inlet 170 as discussed above for process chamber 112.

At 204, the first flow rate of the flow controller 166 may be determine using the mass flow verifier 174. For example, the first flow rate may be determined using rate of rise in a pressure in a known volume or a similar verification method. As discussed above, the mass flow verifier 174 may be configured for choked flow or flow conductance of each conduit may be known or substantially similar. For example, if the first flow rate as determined by the mass flow verifier 174 differed substantially from the first flow rate as read by the flow controller 166, the flow controller 166 may be calibrating based on the determined first flow rate by the mass flow verifier 174. For example, in some embodiments, if a difference ranging from about 1% to about 5% between the determined first flow rate and the first flow rate as read by the flow controller 166 were to exist, the flow controller 166 may require calibration. For example, if the difference is less than about 1%, the flow controller 166 may be considered in condition for operation. If the difference is greater than about 5%, the flow controller 166 may require replacement.

At 206, the mass flow verifier 174 may be cleared of the first gas after the first flow rate of the flow controller 166 is determined by the mass flow verifier 174. For example, the mass flow verifier 174 may be cleared of the first gas by diverting the first gas from the conduit 180 back to the process chamber 132 and/or turning off the flow controller 166. After the flow of the first gas through the conduit 180 has ceased, the first gas may be removed via an outlet (not shown) of the mass flow verifier 174 by a vacuum pump or the like (not shown) coupled to or part of the system 100.

At 208, a second gas may be provided by a second flow controller coupled to a second process chamber at a second flow rate to the mass flow verifier 174. For example, the second flow controller may be the flow controller 162 which may provide the second gas to the process chamber 112 under typical operating conditions; however, during flow verification the second gas is diverted as discussed above through the conduit 178 to the mass flow verifier 174. In some embodiments, the second gas may be substantially equivalent to the first gas. In some embodiments, the second flow rate may be substantially equivalent to the first flow rate. In some embodiments, while the flow rate of the flow controller 162 is being verified by the mass flow verifier 174, the flow controller 166 may be providing the first gas to the process chamber 132. In some embodiments, while the flow rate of the flow controller 162 is being verified, the flow controller 166 may be turned off. Similarly, the flow controller 162 may have been any one of providing the first gas to the process chamber 112 or turned off while the flow controller 166 was being verified at 202 and 204 as described above.

At 210, the second flow rate of the flow controller 162 may be determine using the mass flow verifier 174. For example, the second flow rate may be determined by any of the methods discussed above at 204. For example, in some embodiments, if a difference ranging from about 1% to about 5% between the determined second flow rate and the second flow rate as read by the flow controller 162 were to exist, the flow controller 162 may require calibration. For example, if the difference is less than about 1%, the flow controller 162 may be considered in condition for operation. If the difference is greater than about 5%, the flow controller 162 may require replacement.

Figure 3:
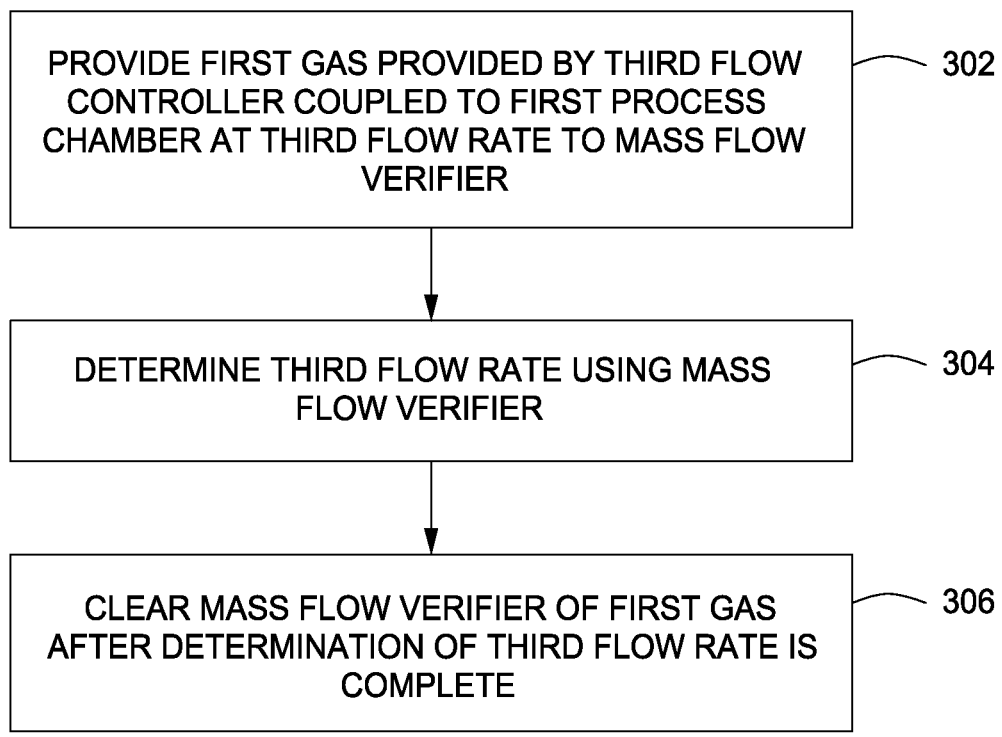
FIG. 3 depicts a flow chart of a method for calibrating a plurality of flow controllers in a substrate processing system in accordance with some embodiments of the present invention.

Alternative to or in combination with the method steps 208-210, the method 200 may proceed to 302 (as shown in FIG. 3) where the first gas provided by a third flow controller to the first process chamber at a third flow rate may be provided to the mass flow verifier 174. For example, the third flow controller may be the flow controller 168 which provides the first gas to the process chamber 132 under typical operating conditions; however, during flow verification the first gas is diverted as discussed above through the conduit 182 to the mass flow verifier 174. For example, during typical operating conditions, the flow controller 168 provides the first gas to the process chamber via a second inlet 173, where the second inlet 173 is substantially equivalent to the second inlet 172 as discussed above for process chamber 112. For example, the method 200 may proceed to 302 after the first gas has been cleared from the mass flow verifier 174 at 206. Alternatively, the method 200 may proceed to 302 after the second gas has been cleared from the mass flow verifier 174 (not illustrated in flow chart of method 200 in FIG. 2-3) after the flow controller 162 has been verified at 210.

As discussed above, the flow controllers 166, 168 may be part of a multi-channel flow ratio controller 158 which includes a shared inlet 160 for receiving the first gas, which may for example be a mixture of process gases provided from the outlet of the mixer 156, and may distribute the first gas (e.g., a singular gas or a mixture of gases) to the process chambers 112, 132 via one or more flow controllers (and in this exemplary embodiment, to the process chamber 132 via the flow controllers 166, 168). For example, the flow controllers 166, 168 may provide the first gas to the process chamber 132 at a desired flow rate ratio between the first and second inlets 171, 173. The desired flow rate ratio may be achieved, for example, by setting the first and third flow rates of the flow controllers 166, 168 to desired flow rates. To confirm that the desired flow rate ratio is being delivered to the process chamber 132 via the flow controllers 166, 168, the flow rate of each flow controller can be independently verified by the mass flow verifier 174. For example, as discussed above, the flow controller 166 has been verified at 204.

At 304, the third flow rate of the flow controller 168 may be determine using the mass flow verifier 174. For example, the third flow rate may be determined by any of the methods discussed above at 204. For example, in some embodiments, if a difference of about +/−5% between the determined third flow rate and the third flow rate as read by the flow controller 168 were to exist, the flow controller 168 may require calibration.

Similar to embodiments discussed above, either or both of the flow controllers 162, 166 may be idled or providing a gas to one of the respective process chambers 112, 132 while the flow controller 168 is being verified as discussed below. For example, in some embodiments, the second gas can be provided to the process chamber 112 via the flow controller 162 (and/or via the flow controller 164) to process a substrate (not shown) disposed in process chamber 112 while the flow controller 168 is being verified by the mass flow verifier 174. Further, the flow controller 166 may be idle or operating while the flow controller 168 is being verified by the mass flow verifier 174.

Further, after determining the third flow rate at 304, the flow rate ratio of the first gas being provided to the process chamber 132 via the first and second inlets 171, 173 by the flow controllers 166, 168 can be determined by comparing the determined first and third flow rates. Similarly, and discussed above, the first and third flow controllers can be calibrated individually based on the determined flow rate ratio, or alternatively, the multi-channel flow ratio controller 158 may be calibrated as a whole based on the determined flow rate ratio.

At 306, the mass flow verifier 174 may be cleared of the first gas after determination of the third flow rate for the flow controller 168 is completed. For example, the mass flow verifier 174 may be cleared using any of the methods discussed above. After the mass flow verifier 174 is cleared of the first gas at 306, the method 200 may, for example, proceed to step 208 or alternatively proceed to verify another flow controller, for example, such as flow controller 186 or other flow controllers associated with shared resource 146C of twin chamber process system 103. In some embodiments, similar to the shared resource 146B, shared resource 146C may include one or more flow controllers 190, 192, 194, 196, 198, a gas panel 191, a mixer 193, or the like. Alternatively, if all flow controllers of the system 100 have been verified by the method 200, the method 200 may begin again, or be performed periodically, or after a desired number of process runs or the like to verify calibration of the flow controllers of the system 100.

Although described above in relation to a cluster tool configuration, the above teachings may also be used to modify a single process chamber having multiple zones in order to facilitate flow verification and calibration of multiple flow meters coupled to the various zones of the single process chamber. Alternatively or in combination, multiple process chambers that are proximately located may also be modified to share a mass flow verifier in accordance with the teachings provided herein. In some embodiments, a twin chamber processing system (e.g., 101) may be modified to share a mass flow verifier in accordance with the teachings provided herein without being mounted on a cluster tool.

Thus, methods and apparatus for calibrating a plurality of flow controllers in a substrate processing system are disclosed herein. The inventive methods and apparatus advantageously facilitate measuring one or more flow rates provided by one or more flow controllers in direct comparison to both a reference standard (e.g., a mass flow verifier) and to other flow controllers coupled to one or more process chambers in various configurations. The inventive systems and methods thus may advantageously provide decreased time required to calibrate each of the flow controllers and improved uniformity between the flow controller measurements, thereby facilitating improved chamber matching (e.g., improved uniformity of process results between two different chambers operating under similar process conditions).

While the foregoing is directed to embodiments of the present invention, other and further embodiments of the invention may be devised without departing from the basic scope thereof.

The invention claimed is:

1. A method for calibrating a plurality of flow controllers in a substrate processing system comprising a first process chamber and a second process chamber coupled to a central vacuum transfer chamber, the method comprising:
    providing a first gas at a first flow rate from a first flow controller coupled to a first process chamber;
    diverting the first gas to a mass flow verifier via a first conduit;
    determining the first flow rate using the mass flow verifier;
    providing a second gas at a second flow rate from a second flow controller coupled to a second process chamber;
    diverting the second gas to the mass flow verifier via a second conduit; and
    determining the second flow rate using the mass flow verifier.

2. The method of claim 1, further comprising:
    calibrating the first flow controller based on the determined first flow rate by the mass flow verifier; and
    calibrating the second flow controller based on the determined second flow rate by the mass flow verifier.

3. The method of claim 1, wherein a first conduit coupling the first flow controller to the mass flow verifier and a second conduit coupling the second flow controller to the mass flow verifier have substantially the same flow conductance.

4. The method of claim 1, wherein a first conduit coupling the first flow controller to the mass flow verifier and a second conduit coupling the second flow controller to the mass flow verifier have different flow conductance, and wherein the mass flow verifier is further configured such that a flow rate of the first gas entering the mass flow verifier from the first conduit is independent of the flow conductance in the first conduit and a flow rate of the second gas entering the mass flow verifier through the second conduit is independent of the flow conductance in the second conduit.

5. The method of claim 1, further comprising:
    flowing the first gas to the first flow controller from a first gas panel; and
    flowing the second gas to the second flow controller from a second gas panel.

6. The method of claim 1, wherein the first gas and the second gas are the same gas and wherein the first gas and the second gas are provided to the first and second flow controllers from a common gas panel shared between the first and second process chambers.

7. The method of claim 1, further comprising:
    idling the first flow controller after the determination of the first flow rate of the first flow controller is complete and prior to providing the second gas using the second flow controller to the mass flow verifier.

8. The method of claim 1, further comprising:
    reinitiating the flow of the first gas by the first mass flow controller to the first process chamber after the determination of the first flow rate of the first flow controller is complete; and
    maintaining the flow of the first gas by the first flow controller to the first process chamber while determining the second flow rate of the second flow controller.

9. The method of claim 1, further comprising:
    providing the first gas at a third flow rate from a third flow controller coupled to the first process chamber;
    diverting the first gas to the mass flow verifier via a third conduit; and
    determining the third flow rate using the mass flow verifier, wherein the first flow controller provides the first gas to a first gas inlet of the first process chamber and the third flow controller provides the first gas to a second gas inlet of the first process chamber.

10. The method of claim 9, further comprising:
    comparing the determined first and third flow rates to determine a flow rate ratio; and
    calibrating the first and third flow controllers based on the determined flow rate ratio.

11. The method of claim 9, wherein the mass flow verifier is further configured such that a flow rate of the first gas entering the mass flow verifier from a first conduit is independent of the flow conductance in the first conduit and a flow rate of the first gas entering the mass flow verifier through a third conduit is independent of the flow conductance in the third conduit.

12. The method of claim 1, wherein a first conduit coupling the first flow controller to the mass flow verifier and a second conduit coupling the second flow controller to the mass flow verifier have different volumes, wherein the mass flow verifier is further configured such that a flow rate of the first gas entering the mass flow verifier from the first conduit is independent of the volume in the first conduit and a flow rate of the second gas entering the mass flow verifier through the second conduit is independent of the volume in the second conduit.

13. A method for calibrating a plurality of flow controllers in a substrate processing system, the method comprising:
    providing a first gas to a mass flow verifier by a first flow controller coupled to a first zone of a first process chamber;
    determining a first flow rate of the first gas using the mass flow verifier;
    providing a second gas to the mass flow verifier by a second flow controller coupled to a second zone of the first process chamber; and
    determining a second flow rate of the second gas using the mass flow verifier, wherein the first flow controller is capable of providing the first gas to the first zone while the second flow controller is providing the second gas to the mass flow verifier.

14. The method of claim 13, wherein the first gas and the second gas are provided at respective flow rates intended to obtain a desired flow ratio, and further comprising:
    determining an actual flow ratio between the first and second flow rates; and
    comparing the actual flow ratio to the desired flow ratio to determine whether the desired flow ratio is provided.

15. A substrate processing system, comprising:
    a cluster tool comprising a first process chamber and a second process chamber coupled to a central vacuum transfer chamber;
    a first flow controller to provide a process gas to the first process chamber;
    a second flow controller to provide the process gas to the second process chamber;
    a mass flow verifier to verify a flow rate from each of the first and second flow controllers;
    a first conduit to selectively couple the first flow controller to the mass flow verifier; and
    a second conduit to selectively couple the second flow controller to the mass flow verifier.

16. The substrate processing system of claim 15, wherein the first and second conduits have the same flow conductance.

17. The substrate processing system of claim 15, wherein the mass flow verifier further comprises:
a critical flow nozzle, wherein a flow rate of the first gas flowing through the critical flow nozzle is independent of the flow conductance in the first conduit and wherein a flow rate of the second gas flowing through the critical flow nozzle is independent of the flow conductance in the second conduit.

18. The substrate processing system of claim 15, further comprising:
a shared gas panel for providing the process gas to the first and second flow controllers.

19. The substrate processing system of claim 15, further comprising:
a third flow controller to provide the process gas to the first process chamber; and
a third conduit to selectively couple the third flow controller to the mass flow verifier to verify a flow rate from the third flow controller;
wherein the any two of the first, second, or third flow controllers is capable of flowing the process gas to a respective one of the first or second process chambers while any one of the first, second, or third flow controllers is being verified by the mass flow verifier.

20. A substrate processing system, comprising:
a first flow controller to provide a process gas to a first zone of a first process chamber;
a second flow controller to provide the process gas to a second zone of the first process chamber;
a mass flow verifier to verify a flow rate from each of the first and second flow controllers;
a first conduit to selectively couple the first flow controller to the mass flow verifier; and
a second conduit to selectively couple the second flow controller to the mass flow verifier.

* * * * *